United States Patent [19]

Kondo et al.

[11] Patent Number: 5,554,443
[45] Date of Patent: Sep. 10, 1996

[54] BONDING WIRE WITH HEAT AND ABRASION RESISTANT COATING LAYERS

[75] Inventors: Hiroyuki Kondo, Kawasaki; Kohei Tatsumi, Yokohama; Masao Kimura, Kawasaki; Kiyoshi Onodera, Kawaguchi, all of Japan

[73] Assignees: Texas Instruments Incorporated, Dallas, Tex.; Nippon Steel Corporation, Japan

[21] Appl. No.: 440,177

[22] Filed: May 12, 1995

Related U.S. Application Data

[63] Continuation of Ser. No. 672,275, Mar. 20, 1991, abandoned.

[30] Foreign Application Priority Data

Mar. 20, 1990 [JP] Japan ........................................ 2-68423

[51] Int. Cl.$^6$ ........................................ D02G 3/00
[52] U.S. Cl. ........................ 428/375; 428/379; 428/383; 428/390; 174/120 SR
[58] Field of Search ........................... 428/375, 379, 428/383, 380; 174/120 SR; 257/784; 228/179; 427/116

[56] References Cited

U.S. PATENT DOCUMENTS

| | | | |
|---|---|---|---|
| 3,523,820 | 8/1970 | Sheffer | 174/120 SR |
| 4,331,800 | 5/1982 | Inata et al. | 525/437 |
| 4,342,814 | 8/1982 | Usuki et al. | 428/383 |
| 4,379,807 | 4/1983 | Otis et al. | 174/120 SR |
| 4,420,535 | 12/1983 | Walrath et al. | 428/379 |
| 4,459,383 | 7/1984 | Lee | 428/379 |
| 4,503,124 | 3/1985 | Kean et al. | 174/120 SR |
| 4,505,978 | 3/1985 | Smith | 428/379 |
| 4,511,624 | 4/1985 | Kawaguchi et al. | 428/379 |
| 4,537,804 | 8/1985 | Kean et al. | 174/120 SR |
| 4,678,114 | 7/1987 | Egawa et al. | 228/179 |
| 4,751,107 | 6/1988 | Reiter et al. | 427/116 |
| 4,942,105 | 7/1990 | Yu | 430/59 |
| 5,037,023 | 8/1991 | Akiyama et al. | 228/179 |
| 5,396,104 | 3/1995 | Kimura | 257/784 |

FOREIGN PATENT DOCUMENTS

| | | |
|---|---|---|
| 107067 | 4/1989 | Japan . |
| 114580 | 5/1989 | Japan . |
| 01122506 | 8/1989 | Japan . |

*Primary Examiner*—N. Edwards
*Attorney, Agent, or Firm*—William E. Hiller; Richard L. Donaldson

[57] ABSTRACT

A resin-coated, bonding fine wire for use in forming bonded electrical connections on a semiconductor device, wherein the bonding wire comprises an elongated fine wire of electrically conductive material, and first and second non-conductive coating layers. The first non-conductive coating layer covers the elongated fine wire and is of a material having good insulating property and heat resistance. The second non-conducting coating layer covers the first non-conductive coating layer and is of a material having good abrasion resistance. The first non-conductive coating layer includes at least one aromatic polyester resins, and the second non-conductive coating layer includes at least one resin selected from the group consisting of polyurethanes, polyester imides and polyimides. The second non-conductive coating layer is built up from a plurality of successive coats to define the second non-conductive coating layer as a non-conductive multilayer coating structure.

16 Claims, 1 Drawing Sheet

BONDING WIRE WITH HEAT AND ABRASION RESISTANT COATING LAYERS

This application is a continuation, of application Ser. No. 07/672,275, filed Mar. 20, 1991, now abandoned.

BACKGROUND OF THE INVENTION

Field of the Invention

This invention relates to a bonding wire for use in forming bonded electrical connections for connecting leads to electrodes (pads) on a semiconductor chip, and more particularly to a bonding fine wire coated with insulating and abrasion-resistant layers.

A semiconductor chip is connected through bonding fine wires to leads which provide output terminals. For example, as shown in FIG. 2b, a circuit terminal (pad) 4 is provided on a semiconductor chip 3 mounted on a tab member 1 by an adhesive layer 2. This pad 4 is connected to an output terminal 5 by a bonding fine wire 6 the ends of which are bonded onto the pad 4 and the output terminal 5, respectively. The bonding fine wire is unreeled (not shown), guided by a roller 9 and clamper 8 etc. and reaches the end of the bore 10 of a tool (capillary) 7. At the end of the capillary 7, the leading end of the fine wire is heated into a melt and formed into a ball 11 by gas heating or arc heating etc. This ball is bonded onto a pad 4 through the capillary by thermocompression with or without ultrasonic vibration to make a bond (the first bond) 12. Subsequently, the fine wire is pulled out of the capillary 7 to reach an inner lead, and is bonded to the inner lead 5 (the second bond) with the aid of the end of the capillary 7 by thermocompression in combination with ultrasonic vibration.

A bonding fine wire of an electrically conductive metal, usually Au, Cu or Al, etc., is employed, with the fine wire assuming a certain loop height for connecting a pad to a lead. Because the fine wire is drawn from the heated end thereof on the pad through the capillary 7, the loop frequently sags, which sometimes results in a short circuit between the semiconductor chip and the fine wire. Particularly recently with the development of larger scale IC's involving the use of multiple pin structures, a tendency towards a longer distance between pad and lead has arisen. The use of a longer wire span for coping with this increased distance makes it easy for the fine wire to sag. This curling of the fine wire can cause unwanted contact to occur between the adjacent fine wires, which may result in short circuits being formed. The occurrence of defective electrical connections due to the short circuits formed by contact between adjacent fine wires because of the sagging and curling of these fine wires presents a significant problem.

As a countermeasure against such a problem encountered with the use of high-density, fine wires as above-mentioned, that is, for preventing short circuits between bonding fine wires or between fine wires and semiconductor elements, bonding fine wires covered over the surface thereof with an insulating film have been proposed, as for example, in Japanese Patent Laid-Open Application Nos. Sho. 58-3239 and 59-154054. Insulating materials disclosed in these patent specifications are of high molecular resins. When used, some of these resins may leave contaminating material such as carbon residue in the lower portion of the ball appearing during the aforesaid first bonding. This circumstance causes a poor bonding of the fine wire onto the pad.

Japanese Patent Laid-Open Application No. Sho. 63-318132 discloses a bonding process and apparatus intended to prevent a poor bond of the fine wire to the pad due to the presence of molten resin at the ball, and/or the formation of a resin lump associated with the upward extension of melting during the heating of the leading end of the fine wire, wherein a fluid such as an inert gas is blow onto the leading end of the fine wire to cause molten resin to fly off and the molten resin is then removed by suction. The use of such an apparatus becomes too complicated, however, when it is to be attached to equipment for bonding a large number of fine wires for electrical connections, successively where the respective fine wires are to be closely spaced to each other.

Japanese Application Nos. Hei. 1-107067 and 114580 are directed to a bonding fine wire which has a good insulating quality, being coated with a resin selected from the group of aromatic polyesters and polycarbonate resins having specified physical properties, without using the above-mentioned complex apparatus.

Insulation-coated fine wires typically have the following characteristics:

(1) Insulating quality (Prevention against short circuits between the fine wire and a semiconductor chip or between respective fine wires caused by contact).

(2) Heat resistance (Prevention against the upward extension of melting from the ball at the leading end of the fine wire (upward peeling) and against melting of the insulating resin).

(3) Bonding property (Ability of the fine wire to be successively bonded, and to maintain bonding strength).

The resin-coated bonding fine wire described in the above-mentioned Japanese patent applications has these characteristics. However, a resin-coated bonding fine wire with these characteristics cannot be considered completely satisfactory in certain respects.

That is, in the bonding of resin-coated fine wire as described above, the coated wire touches bonding equipment when moving or when brought to a stop. For example, the resin coated fine wire may be clamped by a clamping member during movement or when brought to a stop; there may be contact by the resin-coated fine wire with the inside surface of the capillary while the resin-coated fine wire is being drawn from the first bonding to the second bonding; the association with ultrasonic vibration of the capillary for the second bonding may cause contact; and particularly, the pulling of the resin-coated fine wire by the clamping member for cutting the wire after completing the second bonding results in vigorous contact with the coated surface of the fine wire causing the resin coat to become flawed and to tear. When the surface state of the resin coat is damaged, its insulating function may be seriously impaired.

Thus, in spite of a desire for an insulating coating offering characteristics dealing with the above-mentioned types of situations, the manufacture of a coated fine wire satisfying problems associated with these situations has not been achieved.

It is the principal object of the present invention to provide a fine wire of an electrically conductive metal having a resin coating superior in insulating property, heat resistance, bonding property, and also abrasion resistance for use in forming a bonded electrical connection in a bonding operation of successive bonded connections without requiring a special apparatus having fluid blowing and suction inducing capabilities during the bonding operation, for example.

In order to achieve the above-mentioned object, a resin-coated fine wire for use in forming bonded electrical connections on a semiconductor device is provided in accordance with the present invention in which the resin coat includes a first layer of a resin having a good insulating property and heat resistance and a second layer of a resin having good abrasion resistance over the first layer.

In another aspect of the invention, resin-coated fine wire for use in forming bonded electrical connections on a semiconductor device is provided in which a composite resin coating covering the fine wire of electrically conductive metallic material includes a first coating layer made of at least one resin selected from the group consisting of aromatic polyester resins, such as polyarylate resins and polycarbonate resins, and a second coating layer made of at least one resin selected from the group consisting of polyurethanes, polyester imides, and polyimides.

In a further aspect of the invention, a resin-coated fine wire for use in forming bonded electrical connections on a semiconductor device is provided in which the resin coating includes a first resin coating layer 0.1 to 1.2 µm thick and a second resin coating layer 0.1 to 1.0 µm thick.

DESCRIPTION OF THE PREFERRED EMBODIMENTS

Figure 1A:
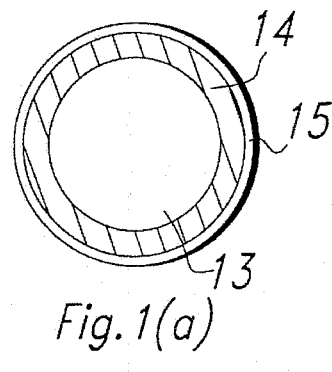
FIG. 1(a) is a cross-sectional view of a resin-coated fine wire according to the present invention.
Figure 1B:
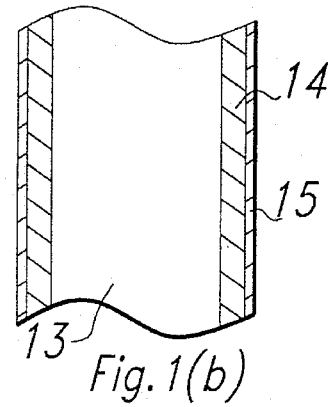
FIG. 1(b) is a longitudinal sectional view of the resin-coated fine wire of FIG. 1(a)
Figure 2A:
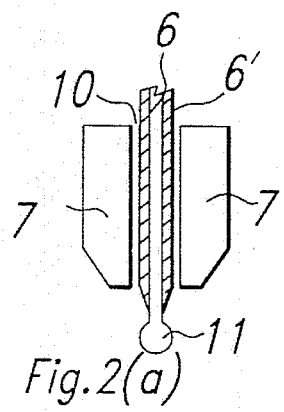
FIG. 2(a) illustrates an aspect of a bonding process showing the formation of a ball at the leading end of the resin-coated fine wire of FIGS. 1(a) and 1(b)
Figure 2B:
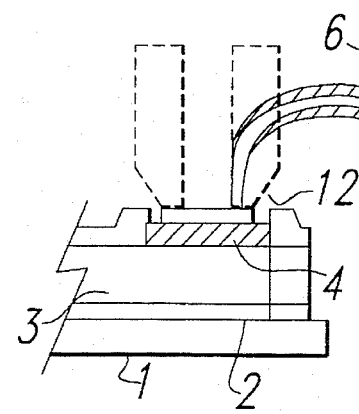
FIG. 2(b) illustrates a stage during the bonding process.
Figure 2B:
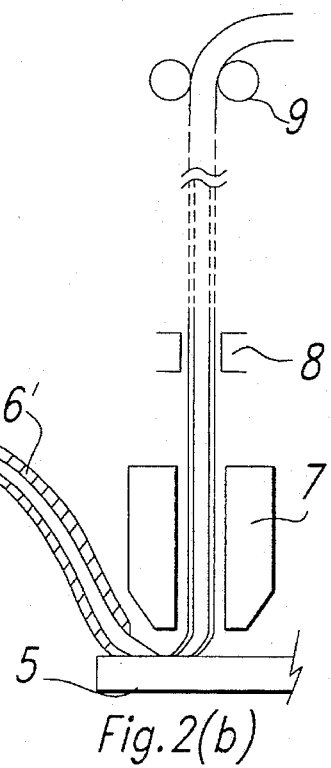

As previously described, insulated wires having single-layer coatings of different high molecular resins covering a fine wire of electrically conductive metallic material have been already proposed. However, these resins do not provide all of the characteristics appropriate to a resin-coated fine wire to be used in forming bonded electrical connections on a semiconductor device. In accordance with the present invention, the coating construction of insulating material on the surface of a fine wire 13 of an electrically conductive metal comprises a double layer (14, 15) of insulating material, as illustrated in FIG. 1(a), and 1(b) the layers comprising respective resins having different characteristics to play respective parts when the resin-coated fine wire is being employed in a bonding operation.

In other words, a suitable resin from which the first insulating layer 14 may be made would include at least one resin selected from the group consisting of aromatic polyesters, such as polyarylate and polycarbonates, and has, in addition to good heat resistance and insulating properties, a superior ability to be successively bonded at a low temperature. A suitable resin from which the second insulating layer 15 may be made would include at least one resin selected from the group consisting of polyurethanes, polyester imides, and polyimides and has good abrasion resistance. The resin of each layer not only has a good bonding property, but also can readily peel off for the ball formation at the first bonding site, and enables very smooth bonding by thermocompression at the second bonding site. Such a double-layer insulation structure contributes to an improvement in the adhesiveness of both layers, and inhibits melting from extending up from the ball (thereby substantially eliminating the formation of a resin lump), making the previously mentioned apparatus for blowing away molten resin and removing the molten resin by suction unnecessary.

In the present invention, the thicker the better the first insulation layer 14 is from the view point of insulating property. However, if the thickness of the first insulation layer 14 is too great, the effectiveness of the bondability of the fine wire 13 is reduced, and hence an upper limit of the thickness of the first insulation layer 14 was set at 1.2 µm. Conversely, the thinner the first insulation layer 14 is, the better the bondability of the fine wire 13 becomes. A first insulation layer 14 with an exceedingly small thickness causes its insulating quality (withstand voltage) to be lower, and hence a lower limit of the thickness of the first insulation layer 14 was set at 0.1 µm. The heat resistance of the first insulation layer 14 is sufficient in this thickness range. The preferred thickness range of the first insulation layer 14 is between 0.1 and 1.0 µm, most preferably 0.2 to 1.0 µm. The thickness of the second insulation layer is set in the range of 0.1 to 1.0 µm to inhibit melting from extending up the fine wire 13 when a ball is formed by heat applied at the leading end thereof, thereby substantially eliminating the formation of a resin lump, which if formed would result in defective bonding of the fine wire 13, and in addition from the viewpoint of providing abrasion resistance. The preferred thickness range of the second insulation layer 15 is 0.2 to 1.0 µm, most preferably 0.2 to 0.6 µm.

The total thickness of the first and second insulation layers 14 and 15 added together is in the range of 0.3 to 1.6 µm, preferably 0.5 to 1.5 µm.

For increasing the completeness of the second insulation layer 15, it is desirable to form it as a multi-layer coating structure by repeatedly applying successive coatings of an abrasion-resistant resin to the first insulation layer 14.

Any suitable resin from which the first insulation layer 14 may be made in accordance with the present invention preferably has a melt index range between 1.0 to 100 g/10 min (according to ASTM-D 1238; temperature 280° C., load 2,160 kg). That is, viscosities at up to 1.0 g/10 min are too high, making it difficult to achieve uniform thickness of the coating. Viscosities at 100 g/10 min and higher are too low, resulting in inferior insulating quality.

Suitable coating techniques for applying the first and second insulation layers 14 and 15 in accordance with the present invention may include extrusion coating, electrostatic powder-coating, spray coating, electrodeposition coating, and dip coating, etc. In order to achieve a uniform double-layer coating, it is preferred to use dip coating.

Moreover, in a resin used as an insulation layer in accordance with the present invention, additives and/or agents such as antioxidants, flame inhibiting agents, fillers, voltage stabilizing agents, lubricants, additives for processing, and ultraviolet ray absorbers may be suitably incorporated.

Au wires of 30 µm in diameter were coated with polyarylate resin as the first insulation layer 14 and polyurethane as the second insulation layer 15 to obtain bonding wires with different coating thicknesses. In other examples, similar wires were coated with polycarbonate as the first insulation layer 14 and polyurethane as the second insulation layer 15 to obtain four bonding wires of different coating thicknesses. Dip coating was employed to apply the first and second insulation layers to the Au wire in these examples.

The coating thicknesses (i.e. layer thicknesses) of the first and second insulation layers of respective samples are given in Tables 1 and 2;. Samples A, B, J and O are reference samples, in which the layer thicknesses are outside of the scope of the present invention.

The samples were tested for ability to be successively bonded (bonding property), insulating quality, heating resistance, and abrasion resistance. The results are summarized in Table 3.

TABLE 1

Description of coating layer (1)

| Coating layer | Resin | Thickness of sample (μm) | | | | | | | | | | |
|---|---|---|---|---|---|---|---|---|---|---|---|---|
| | | A | B | C | D | E | F | G | H | I | J | K |
| First layer | Polyarylate (13) | 1.0 | 0 | 0.2 | 0.8 | 1.0 | 1.2 | 0.4 | 0.8 | 0.8 | 1.0 | 1.2 |
| Second layer | Polyurethane (20) | 0 | 1.0 | 1.0 | 0.2 | 0.5 | 0.3 | 0.4 | 0.6 | 0.8 | 1.0 | 0.2 |

Figures in parentheses indicate melt index.

TABLE 2

Description of coating layer (2)

| Coating layer | Resin | Thickness of sample (μm) | | | |
|---|---|---|---|---|---|
| | | L | M | N | O |
| First layer | Polycarbonate (18) | 0.4 | 0.6 | 1.0 | 0.1 |
| Second layer | Polyurethane (20) | 0.4 | 0.2 | 0.5 | 0.1 |

Figures in parentheses indicate melt index.

TABLE 3

Measured results of characteristics

| Characteristics Sample | Bonding property | Insulating property | Heating resistance | Abrasion resistance |
|---|---|---|---|---|
| A | ○ | ○ | ○ | X |
| B | ○ | ○ | X | ○ |
| C | ○ | ○ | Δ | ○ |
| D | ○ | ○ | ○ | ○ |
| E | ○ | ○ | ○ | ○ |
| F | Δ | ○ | ○ | ○ |
| G | ○ | ○ | ○ | ○ |
| H | ○ | ○ | ○ | ○ |
| I | Δ | ○ | ○ | ○ |
| J | X | ○ | ○ | ○ |
| K | Δ | ○ | ○ | ○ |
| L | ○ | ○ | ○ | ○ |
| M | ○ | ○ | ○ | ○ |
| N | ○ | ○ | ○ | ○ |
| O | ○ | X | X | X |

Ability to be successively bonded was determined by 20,000 successive bondings between coated fine wire samples and lead frames and a further pull test (a coated fine wire is hooked and then is pulled upward at 0.5 mm/minute until the bonded fine wire is fractured or released from the pad or lead, with the load at this time, i.e. maximum load, being measured). The summed percentage of those samples which failed to pass the bonding test and those samples having maximum loads not reaching 4 g just prior to fracture is taken as a rejection. Marks ○, Δ, and X designate rejections of not more than 0.01%, 0.01 to 0.1% and 0.1% or more, respectively.

For determining the insulating property, the ability of coating to withstand voltage is measured. Marks ○ and X designate 30 V and higher and up to 30 V, respectively.

For heat resistance, marks X and ○ designate cases where, in response to the bonding, the coating becomes peeled off upward from the ball at the leading end of the fine wire over 200 μm and longer and up to 200 μm, respectively. For abrasion resistance, X designates cases where one or more peelings of the second insulation layer 15 are found per span of 2 mm the direction of the fine wire, and ○ designates the other cases.

As is apparent from the results shown in Table 3, all samples having first and second insulation layers 14 and 15 provided on an Au wire and having thicknesses within the scope of the present invention passed the tests and exhibited good characteristics as bonding wires. Reference samples A and B having a single-layer insulation coating are inferior in heat resistance and abrasion resistance; thinly-coated sample ○ has proved to be incapable of being put to practical use; and sample J with a total thickness of the two insulation layers greater than the largest total thickness of the two insulation layers within the scope of the present invention exhibits a poor bonding property.

Thus, double-layer coated bonding fine wires according to the present invention have good insulating property, heat resistance, bonding property and abrasion resistance. Therefore, defective bonding when using bonding fine wires according to the present invention is not found. Peeling flaws and short circuits between fine wires or between a fine wire and the semiconductor chip can be prevented. In addition, it is possible to attain a reduction of the lead distance so as to increasingly enable very large scale IC's to be constructed with accompanying high product yield and significant industrial value.

What is claimed is:

1. A bonding wire for use in forming bonded electrical connections on a semiconductor device, said bonding wire comprising:

an elongated fine wire of electrically conductive material;

first and second non-conductive coating layers of different resins with respect to each other;

said first non-conductive resin coating layer covering said elongated fine wire of electrically conductive material and including at least one aromatic polyester resin having good insulating property and heat resistance; and said second non-conductive resin coating layer covering said first non-conductive resin coating layer and including at least one resin selected from the group consisting of polyurethanes, polyester imides, and polyimides and having good abrasion resistance.

2. A bonding wire as set forth in claim 1, wherein said second non-conductive resin coating layer comprises a plurality of successive resin coats to define said second non-conductive coating layer as a non-conductive multilayer resin coating structure.

3. A bonding wire as set forth in claim 1, wherein said first non-conductive resin coating layer has a thickness in the range of 0.1 to 1.2 μm;

said second non-conductive resin coating layer has a thickness in the range of 0.1 to 1.0 μm; and the total thickness of said first and second non-conductive resin coating layers is in the range of 0.3 to 1.6 μm.

4. A bonding wire as set forth in claim 3, wherein the thickness range of said first non-conductive resin coating layer is 0.2 to 1.0 μm;

the thickness range of said second non-conductive resin coating layer is 0.2 to 0.6 μm; and the total thickness range of said first and second non-conductive resin coating layers is 0.5 to 1.5 μm.

5. A bonding wire as set forth in claim 3, wherein said first non-conductive resin coating layer is polyarylate resin; and said second non-conductive resin coating layer is polyurethane resin.

6. A composite bonding wire as set forth in claim 5, wherein the thickness range of said polyarylate resin comprising the first non-conductive resin coating layer is 0.2 to 1.0 μm;

the thickness range of said polyurethane resin comprising the second non-conductive resin coating layer is 0.2 to 0.6 μm; and the total thickness range of said polyarylate resin and said polyurethane resin is 0.5 to 1.5 μm.

7. A bonding wire as set forth in claim 3, wherein said first non-conductive resin coating layer is polycarbonate resin; and said second non-conductive resin coating layer is polyurethane resin.

8. A bonding wire as set forth in claim 7, wherein the thickness range of said polycarbonate resin comprising the first non-conductive resin coating layer is 0.2 to 1.0 μm;

the thickness range of said polyurethane resin comprising the second non-conductive resin coating layer is 0.2 to 0.6 μm; and the total thickness range of said polycarbonate resin and said polyurethane resin is 0.5 to 1.5 μm.

9. A composite bonding wire as set forth in claim 1, wherein the diameter of said gold wire is 30 μm.

10. A bonding wire as set forth in claim 1, wherein said fine wire of electrically conductive material is gold.

11. A bonding wire for use in forming bonded electrical connections on a semiconductor device, said bonding wire comprising:

an elongated fine gold wire having a diameter of the order of 30 μm and having electrical conductivity;

first and second non-conductive coating layers of different resins with respect to each other;

said first non-conductive resin coating layer including at least one aromatic polyester resin having good insulating property and heat resistance and covering said elongated fine gold wire;

said second non-conductive resin coating layer including at least one resin selected from the group consisting of polyurethanes, polyester imides, and polyimides having good abrasion resistance and covering said first non-conductive resin coating layer;

said first non-conductive resin coating layer having a thickness in the range of 0.1 to 1.2 μm;

said second non-conductive resin coating layer having a thickness in the range of 0.1 to 1.0 μm; and the total thickness of said first and second non-conductive resin coating layers being in the range of 0.3 to 1.6 μm.

12. A bonding wire as set forth in claim 11, wherein the thickness range of said first non-conductive resin coating layer is 0.2 to 1.0 μm;

the thickness range of said second non-conductive resin coating layer is 0.2 to 0.6 μm; and the total thickness range of said first and second non-conductive resin coating layers is 0.5 to 1.5 μm.

13. A bonding wire as set forth in claim 11, where said first non-conductive resin coating layer is polyarylate resin; and said second non-conductive resin coating layer is polyurethane resin.

14. A bonding wire as set forth in claim 13, wherein the thickness range of said polyarylate resin comprising the first non-conductive resin coating layer is 0.2 to 1.0 μm;

the thickness range of said polyurethane resin comprising the second non-conductive resin coating layer is 0.2 to 0.6 μm; and the total thickness range of said polyarylate resin and said polyurethane resin is 0.5 to 1.5 μm.

15. A bonding wire as set forth in claim 11, wherein said first non-conductive resin coating layer is polycarbonate resin; and said second non-conductive resin coating layer is polyurethane resin.

16. A bonding wire as set forth in claim 15, wherein the thickness range of said polycarbonate resin comprising the first non-conductive resin coating layer is 0.2 to 1.0 μm;

the thickness range of said polyurethane resin comprising the second non-conductive resin coating layer is 0.2 to 0.6 μm; and the total thickness range of said polycarbonate resin and said polyurethane resin is 0.5 to 1.5 μm.

* * * * *